United States Patent [19]

Anderson

[11] Patent Number: 4,859,190

[45] Date of Patent: Aug. 22, 1989

[54] DUAL CONNECTOR PRINTED CIRCUIT BOARD ASSEMBLY AND METHOD

[75] Inventor: Russell Y. Anderson, Mesa, Ariz.

[73] Assignee: Solid State Devices, Tempe, Ariz.

[21] Appl. No.: 161,494

[22] Filed: Feb. 29, 1988

[51] Int. Cl.⁴ ............................................. H05K 3/30
[52] U.S. Cl. ..................................... 439/78; 29/837; 361/404
[58] Field of Search .............................. 439/55, 59–73, 439/78–85; 361/400–410, 413; 174/52 F, 52 P; 29/832, 836–839, 842–845

[56] References Cited

U.S. PATENT DOCUMENTS

| | | | |
|---|---|---|---|
| 3,001,171 | 9/1961 | Schultz | 439/61 |
| 3,771,101 | 11/1973 | Elkins | 361/413 |
| 4,004,196 | 1/1977 | Doucet | 439/70 |
| 4,255,852 | 3/1981 | Johnson et al. | 29/837 |
| 4,451,107 | 5/1984 | Dola et al. | 439/79 |
| 4,641,900 | 2/1987 | Japngie | 439/76 |
| 4,686,607 | 8/1987 | Johnson | 361/412 |
| 4,761,881 | 8/1988 | Bora et al. | 361/400 |

Primary Examiner—Neil Abrams
Attorney, Agent, or Firm—Victor Flores; Harry M. Weiss

[57] ABSTRACT

A printed circuit board assembly having a first main printed circuit board and a connector connecting to the main board. A subsidiary board connects to the connector. The main board has a plurality of socket holes and the connector has a corresponding plurality of pins. The invention overcomes the problem of the prior art assembly, which requires a different main board to accommodate each type of connector having a different pin spacing. The main board of the invention has a combination group of four rows of holes, including a first row of holes and a third row of holes having a same first lengthwise spacing which receive the pins of one type of connector and including a second row of holes and a fourth row of holes having a same second lengthwise spacing which receive the pins of another type of connector. The first row of holes respectively having a first set of outer conductors. The first row of holes also respectively have a first set of inner conductors. Each inner conductor of the first row of holes connects to a nearest hole in the second row of holes. The third row of holes respectively have a second set of inner conductors. Each inner conductor of the third row of holes connects to a nearest hole in the fourth row of holes. The fourth row of holes respectively have a second set of outer conductors.

14 Claims, 1 Drawing Sheet

DUAL CONNECTOR PRINTED CIRCUIT BOARD ASSEMBLY AND METHOD

BACKGROUND OF THE INVENTION

1. Field of the Invention

The invention generally relates to a multi-connector printed circuit board assembly and method and, in particular, to a dual connector printed circuit board assembly and method having parallel rows of socket or via holes for receiving two different printed circuit board connectors to thereby provide significantly increased versatility for the dual connector printed circuit board assembly.

2. Description of the Relative Art

The prior art printed circuit board assembly generally includes a first main or mother board having a group of a first input row and a second output row of socket or via holes, and a connector, for attachment to a printed circuit (daughter) board, having a group of first input row and a second output row of pins with the same spacing as the holes in the main or mother board for connection therewith, and being adapted to join to the daughter or second subsidiary board.

One problem with the prior art printed circuit board assembly is that a different first main or mother board was required to accommodate each type of connector having a different pin spacing.

SUMMARY OF THE INVENTION

According to the present invention, a printed circuit board assembly is provided. The assembly includes a first main board having a combination group of four rows of holes with a first input row and a third output row of holes at a first spacing and with a second input row and a fourth output row of holes at a second spacing, and a connector having a group of a first input row and a second output row of pins at a spacing which is the same as either the first spacing or the second spacing of holes for receival therein, and being adapted to join to a second subsidiary board.

By using the combination group of four rows of holes with a first input row and a third output row of holes at a first spacing and with a second input row and a fourth output row of holes at a second spacing, the problem of the prior art printed circuit board assembly is avoided because a first connector which can be attached to a first subsidiary printed circuit board can be connected to the first input row and third output row of holes of the main or mother board while, alternatively, a second connector which can be attached to a second subsidiary printed circuit board can be connected to the second input row and fourth output row of holes in the main or mother board. Thus, the main or mother printed circuit board can be connected via the first or the second connector to either the first or the second subsidiary board to thereby permit a combined separate electronic function or operation, as desired.

The foregoing and other objects, features and advantages will be apparent from the following description of the preferred embodiments of the invention as illustrated in the accompanying drawings.

BRIEF DESCRIPTION OF THE DRAWINGS

As shown in FIG. 1, a printed circuit board assembly 10 includes a first main or mother printed circuit board 12 and a second subsidiary or daughter board 14, which is disposed slightly above and parallel to the main board 12. Assembly 10 also has a first left side connector 16 and a second right side connector 18.

Figure 1:
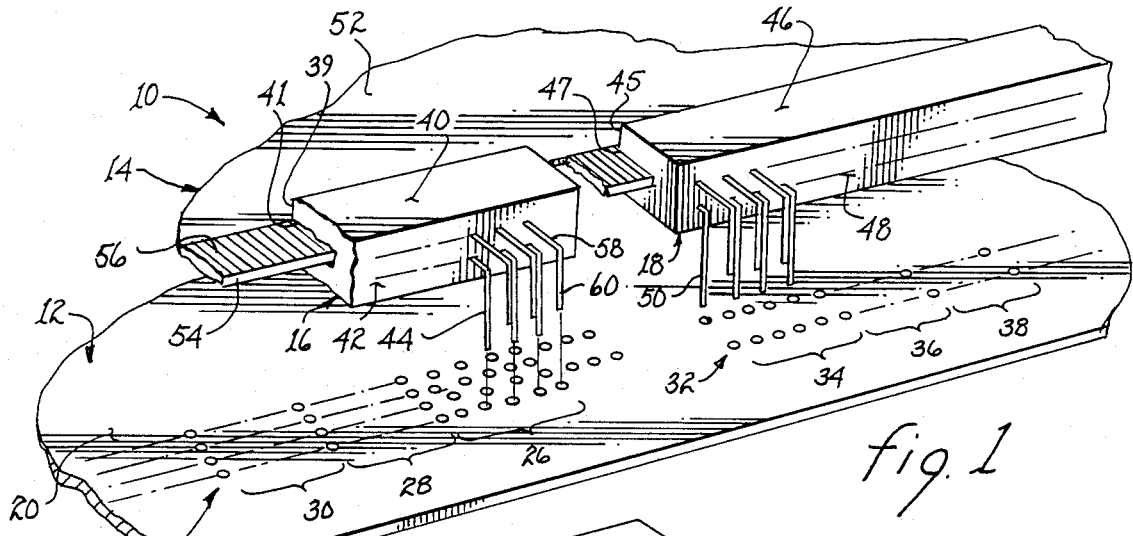
FIG. 1 is a perspective view of a printed circuit board assembly according to the invention.

First main board 12 has an upper surface 20, an edge surface 22, and a left side plurality of via holes or sockets 24. Left side holes 24 are arranged in successive groups 26, 28, 30, which are of identical arrangement. Group 26 is shown in an enlarged view in FIG. 5, as explained hereafter.

First board 12 also has right side plurality of via holes or sockets 32. Right side holes 32 are arranged in successive groups 34, 36, 38, which are of identical arrangement. Group 34 is shown in an enlarged view in FIG. 4, as explained hereafter.

Left side connector 16 includes an upper surface 40, an inner edge surface 39 which has a groove 41, an outer edge surface 42, and a plurality of pins 44. Right side connector 18 also includes an upper surface 46, an inner edge surface 45 which has a groove 47, an outer edge surface 48, and a plurality of pins 50.

Subsidiary board 14 has an upper surface 52, an inner edge surface 54, and a plurality of contacts 56 on the upper surface 52 and lower surface of board 14.

A typical one of pins 44 has a horizontal leg 58 and a vertical leg 60. In FIG. 1, edge surfaces 42, 48 of board 16, 18 are coplanar. Pins 44, 50 are identical.

Figure 5:
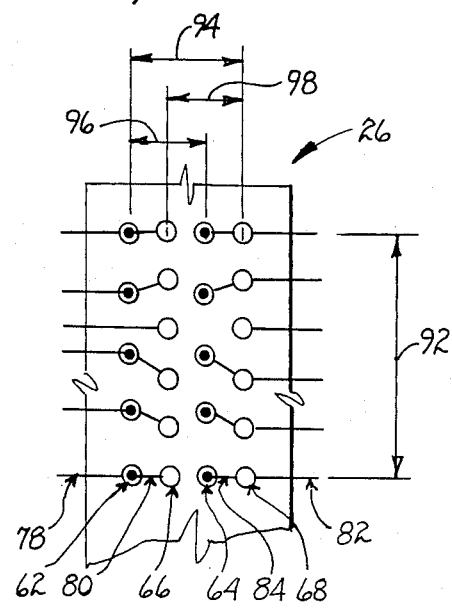
FIG. 5 is an enlarged view of another portion of the assembly of FIG. 1.

In this embodiment, the group of holes 26, which is shown in FIG. 5, has a first set or row of inlet holes 62 and a third set or row of outlet holes 64. If desired, the inlet holes can be outlet holes and the outlet holes can be inlet holes. Holes in rows 62, 64 are spaced at four spaces at, for example, 0.125 inches each. Group 26 has a second row of inlet holes 66 and a fourth row of outlet holes 68. Holes in rows 66, 68 are spaced at five spaces at, for example, 0.100 inches each.

Figure 4:
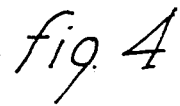
FIG. 4 is an enlarged view of a portion of the assembly of FIG. 1.

In this embodiment, group 34, which is shown in FIG. 4, has a first row of inlet holes 70 and a second row of outlet holes 72. Holes in rows 70, 72 are spaced at five spaces at, for example, 0.100 inches each.

Left side pins 44 fit holes in rows 66, 68 and have the same spacing of five spaces at, for example, 0.100 inches each. Right side pins 50 fit holes in rows 70, 72 and have the same spacing of five spaces at, for example, 0.100 inches each.

An advantage of assembly 10 is that it provides a way to assemble two different types of connectors for two different subsidiary boards into or with a main board 12, or alternately to assemble two similar types of connectors 16, 18 into a main board 12.

If one desires to connect the second board 14 to the first main board 12, then the first and second connectors 16, 18 of the second board 14 are connected to the end 54 of the second board 14, as shown in FIG. 1. Then, the first and second connectors 16, 18 are inserted into the first main board 12. The first connector 16 is inserted into the first arrangement 24 of groups of holes 26, 28, 30, each with rows of holes 62, 64, 66, 68. The second connector 18 is inserted in the second arrangement 32 of groups of holes 34, 36, 38, each with rows of holes 70, 72.

The key feature of the invention is the use of the first arrangement 24 having hole groups 26, 28, 30, each with four rows or sets of holes 62, 64, 66, 68, which has two sets of holes 66, 68 for the first connector 16 and which has two different sets of holes for a different third connector.

An advantage of the invention is that it provides a way to assemble either the first connector 16, or another third connector, in the combination four sets of holes 62, 64, 66, 68. Thus, one can assemble either two similar connectors 16, 18 into board 12, or a different connector into board 12.

Figure 3:
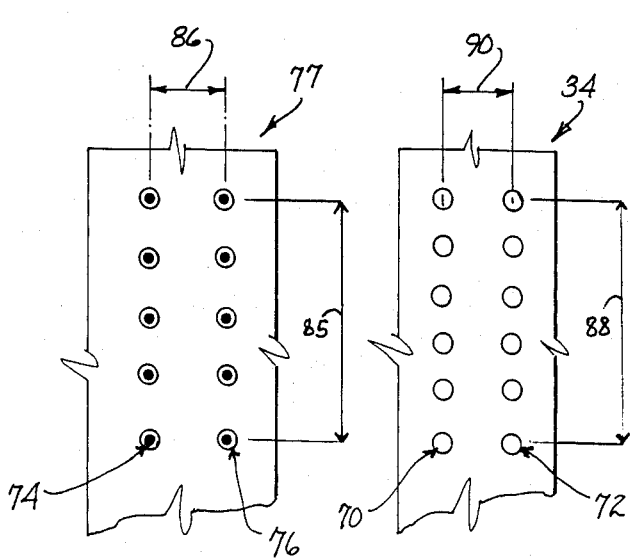
FIG. 3 is an enlarged view of a portion of an assembly similar to a portion of the assembly of FIG. 1.

FIG. 3 shows the plan view of a group 77, of rows of holes 74, 76 of a conventional arrangement for another connector, which has a group of holes 77 having a spacing of four spaces at, for example, 0.125 inches each.

FIG. 4 shows the plan view of group 34 of rows of holes 70, 72 of a conventional arrangement for a connector, like connector 18, which has a group 34 of rows of holes 70, 72 having a spacing of five spaces at, for example, 0.100 inches each.

FIG. 5 shows the plan view of rows of holes 62, 64, 66, 68 of a group 26 according to the invention, for either a connector, like connector 106, which uses rows of holes 62, 64 or a connector like connector 18 which uses rows of holes 66, 68.

Each of the via holes of the main or mother board 12 has a metal cylinder within each of the holes for connection to one or more conductors of a printed circuit pattern of conductors on one or more of the conductive patterns of the board 12. Holes of row 62 have a row of outer conductors 78 and have a row of short conductor 80 each connected to the nearest hole in row 66. Holes of row 64 have a row of short or inner conductors 84, each connected to the nearest hole in row 68. Holes of row 68 have a row of outer conductors 82. The fourth hole in row 66 has an outer conductor only.

Group 77 of holes (see FIG. 4) has a length 85 and width 86. Group 34 of holes (see FIG. 4) has a length 88 and width 90. Group 26 of holes (see FIG. 5) has a length 92 and a width 94. The first and third rows 62, 64 of holes of FIG. 5 correspond to the two rows 74, 76 holes of FIG. 3. The second and fourth rows 66, 68 of holes of FIG. 5 correspond to the two rows 70, 72 of holes of FIG. 4. The width 96 between the first and third rows of FIG. 5 is equal to width 86. The width 98 between the second and fourth rows of FIG. 5 is equal to width 90. The lengths 85, 88, 92 are all equal. The width 94 in FIG. 5 is 50 per cent wider than width 96 or width 98, which are equal.

Figure 2:
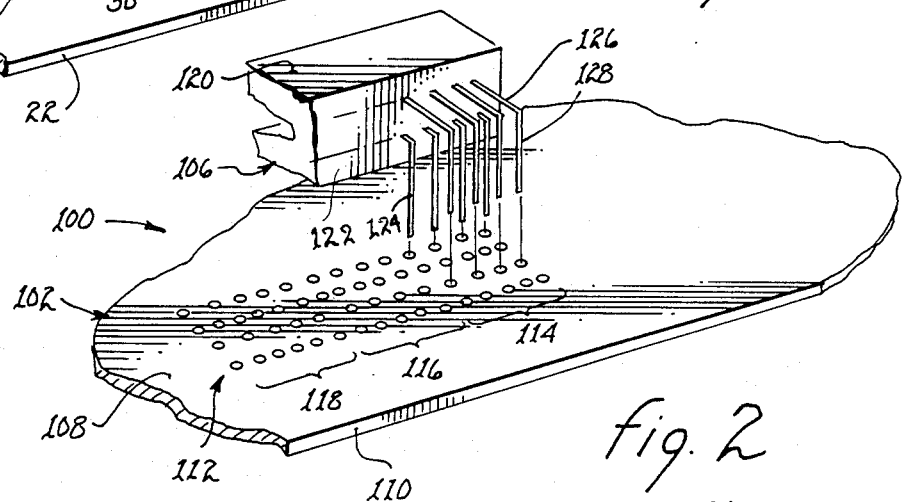
FIG. 2 is a perspective view of another embodiment of the use of the printed circuit board assembly of FIG. 1.

In FIG. 2, a second embodiment of assembly 100 is shown. Assembly 100 includes a main printed circuit board 102 and a connector 106.

First board 102 has an upper surface 108, an edge surface 110, and a plurality of holes 112. Holes 112 include successive groups of holes 114, 116, 118, which are of identical arrangement. Typical group 114 has the same arrangement as typical group 26, as shown in FIG. 1 and in the enlarged view in FIG. 5. The connector 106 is not the same as connector 16, it is a different connector.

Connector 106 has an upper surface 120, an edge surface 122, and a plurality of pins 124. Pins 124 fit into the first inlet row of holes 62 as shown in FIG. 5, and fit into the third outlet row of holes 64.

In this embodiment, pins 124 and corresponding rows of holes 62, 64 have the same spacing of four spaces at, for example, 0.125 inches each. Each of the pins 124 has a horizontal leg 126 and a vertical leg 128.

The advantage of embodiment 100 is that it provides for connecting two different types of connectors into the same area of a single main board 102. The same board 102 can be used for either connector. The connector as selected is then soldered into the board 102.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A printed circuit board assembly for mounting connectors having different pin spacing and enabling electronic coupling to a plurality of commoning conductors, said assembly comprising:

a first main board having a group of at least four rows of holes, said group of at least four rows of holes being arranged in an alternating set of different hole spacing patterns, including a first row of holes and a third row of holes, with the first row of holes and the third row of holes having the same first lengthwise spacing of holes, and including a second row of holes and fourth row of holes, with the second row of holes and fourth row of holes having the same second lengthwise spacing of holes, the second lengthwise spacing of holes being different from the first lengthwise spacing of holes, said first row of holes respectively having a first set of outer conductors and a first set of inner conductors, each inner conductor of said first set of inner conductors connecting to a nearest hole on the second row of holes, said third row of holes respectively having a second set of inner conductors, each inner conductor of said second set of inner conductors connecting to a nearest hole in the fourth row of holes, and said fourth row of holes respectively have a second set of outer conductors; and a connector having a group of at least two rows of input and output pins, including a first row of pins and a second row of pins, with the first row of pins and the second row of pins having a same third lengthwise spacing of pins, the third lengthwise spacing of pins being the same spacing as one of the first lengthwise spacing of holes or the second lengthwise spacing of holes.

2. The assembly of claim 1, wherein the second row of holes has one hole having only an outer conductor, and wherein the fourth row of holes has one hole having only an outer conductor.

3. The assembly of claim 1, wherein the connector is disposed parallel to the main board, and wherein each of the pins has a vertical leg disposed normal to an upper surface of the main board and has a horizontal leg disposed parallel to the upper surface of the main board, and wherein a subsidiary board is connected to the connector and is disposed parallel to the main board.

4. The assembly of claim 1 wherein a subsidiary board is connected to the connector.

5. The assembly of claim 1, wherein the first row of holes and the third row of holes are parallel and have a first transverse spacing therebetween, and the second row of holes and the fourth row of holes are parallel and have a second transverse spacing therebetween.

6. The assembly of claim 5, wherein the first transverse spacing is equal in dimension to the second transverse spacing.

7. The assembly of claim 1, wherein the first lengthwise spacing, the second lengthwise spacing and the third lengthwise spacing are equal in overall dimension, and wherein the first lengthwise spacing and the third lengthwise spacing have overall lengths which are divided into equal dimension between holes, and wherein the second lengthwise spacing and the third lengthwise spacing have overall lengths which are divided into equal dimensions between holes.

8. A method of providing a printed circuit board assembly for mounting connectors having different pin spacing and enabling electronic coupling to a plurality of commoning conductors to permit combining different subsidiary boards to a main board comprising:

providing a first main board having a group of at least four rows of holes, said group of at least four rows of holes being arranged in an alternating set of different holes spacing patterns, including a first row of holes and a third row of holes, with the first row of holes and the third row of holes having the same first lengthwise spacing of holes, and including a second row of holes and fourth row of holes, with the second row of holes and fourth row of holes having the same second lengthwise spacing of holes, the second lengthwise spacing of holes being different from the first lengthwise spacing of holes, said first row of holes respectively having a first set of outer conductors and a first set of inner conductors, each inner conductor of said first set of inner conductors connecting to a nearest hole on the second row of holes said third row of holes respectively having a second set of inner conductors, each inner conductor of said second set of inner conductors connecting to a nearest hole in the fourth row of holes, and said fourth row of holes respectively have a second set of outer conductors;

providing connectors having a group of at least two rows of pins, including a first row of pins for input and a second row of pins for output, said provided connectors having a third lengthwise spacing along the first row of pins and along the second row of pins to allow the pins to be inserted into appropriate ones of said rows of holes on said first main board; and attaching said provided connectors to said appropriate rows of holes on said main board.

9. The method of claim 8, wherein the second row of holes has one hole having only an outer conductor, and wherein the fourth row of holes has one hole having only an outer conductor.

10. The method of claim 8, wherein the connector is disposed parallel to the main board, and wherein each of the pins has a vertical leg disposed normal to an upper surface of the main board and has a horizontal leg disposed parallel to the upper surface of the main board, and wherein a subsidiary board is connected to the connector and is disposed parallel to the main board.

11. The method of claim 8 wherein a subsidiary board is connected to the connector.

12. The method of claim 8, wherein the first row of holes and the third row of holes are parallel and have a first transverse spacing therebetween, and the second row of holes and the fourth row of holes are parallel and have a second transverse spacing therebetween.

13. The method of claim 12, wherein the first transverse spacing is equal in dimension to the second transverse spacing.

14. The method of claim 8, wherein the first lengthwise spacing, the second lengthwise spacing and the third lengthwise spacing are equal in overall dimension, and wherein the first lengthwise spacing and the third lengthwise spacing have overall lengths which are divided into equal dimensions between holes, and wherein the second lengthwise spacing and the third lengthwise spacing have overall lengths which are divided into equal dimensions between holes.

* * * * *